United States Patent [19]

Aumont et al.

[11] 4,427,900

[45] Jan. 24, 1984

[54] SUPPLY CIRCUIT FOR ELECTRONIC APPARATUS AT A HIGH ELECTRIC POTENTIAL

[75] Inventors: Pierre Aumont; Jean-Pierre Dupraz, both of Aix les Bains, France

[73] Assignee: Alsthom-Atlantique, Paris, France

[21] Appl. No.: 362,325

[22] Filed: Mar. 26, 1982

[30] Foreign Application Priority Data

Mar. 30, 1981 [FR] France .................................. 81 06337

[51] Int. Cl.³ ............................................. H02J 13/00
[52] U.S. Cl. .................... 307/149; 323/361; 323/364; 340/310 A; 361/66
[58] Field of Search ..................... 323/352, 361, 364; 361/63, 64, 66, 113; 340/310 A; 307/149

[56] References Cited

U.S. PATENT DOCUMENTS

| 3,467,889 | 9/1969 | Brough-Cunningham et al. | 361/64 |
| 4,087,701 | 5/1978 | Anderson | 323/361 |
| 4,376,910 | 3/1983 | Peslier | 340/310 A |

FOREIGN PATENT DOCUMENTS 344131  3/1960  Switzerland ........................ 323/364

Primary Examiner—William H. Beha, Jr.
Attorney, Agent, or Firm—Sughrue, Mion, Zinn, Macpeak and Seas

[57] ABSTRACT

Said circuit includes a generator (7) at ground potential and delivering power at a high-frequency which is transmitted to the electronic apparatus (2) to be powered via two high-frequency transformers (10, 8) one of which is at ground potential and the other of which is at the potential of the electronic apparatus (2). Said transformers are galvanically isolated from each other by two capacitors (4 and 9).

7 Claims, 1 Drawing Figure

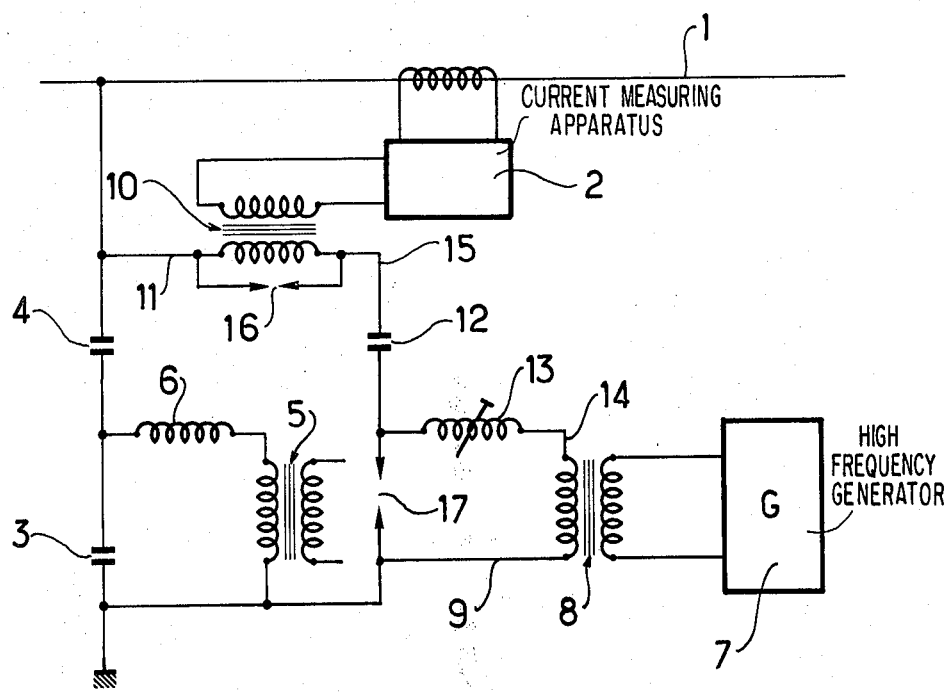

SUPPLY CIRCUIT FOR ELECTRONIC APPARATUS AT A HIGH ELECTRIC POTENTIAL

The present invention relates to supplying power to electronic apparatus which is at a high electric potential relative to the ground, such as, for example, electronic apparatus at the potential of a high-tension electric power line.

BACKGROUND OF THE INVENTION

Electronic apparatus at the potential of a high-tension electric line must still receive power even when no tension is applied to the line. Two known ways of doing this consist, either in using a battery and a charger kept at the potential of the electric line in which case it is necessary to de-energize the line for maintenance or else in supplying power via an isolating transformer (in which case an isolating transformer of considerable dimensions is required to transmit even a few watts of power, once the line is one which operates at several kilovolts).

Preferred embodiments of the present invention avoid these drawbacks while allowing the electronic apparatus to be powered independently from the presence or absence of the electric potential. Such embodiments also provide a supply circuit which is simple to put into use, in particular when equipped with a capacitor voltage transformer which is also used to monitor the high potential.

SUMMARY OF THE INVENTION

The present invention provides a power supply circuit for electronic apparatus at a high electric potential relative to the ground, said power supply circuit comprising:

a generator at ground potential and delivering power for said electronic apparatus in the form of a high-frequency signal at an operating frequency;

a first lightly insulated tranformer having a primary winding connected to output terminals of the generator and a secondary winding having one end for connection to a low potential relative to the ground;

a second lightly insulated transformer having a secondary winding for connection to the power supply input of said electronic apparatus and a primary winding having one end for connection to said high potential; and two capacitors connecting the ends of the secondary winding of the first transformer to the ends of the primary winding of the second transformer and providing galvanic isolation between these two windings.

Advantageously, the secondary winding of the first transformer and the primary winding of the second transformer are equipped with lightning arrestors or with spark gaps which protect them against overvoltages.

One of the capacitors may be the capacitative column of a capacitor voltage transformer which is also used to monitor the high potential. The value of the other capacitor is then at least one order of magnitude lower so as not to disturb the operation of the capacitor voltage transformer.

Advantageously, the generator operates at a frequency of about 1.5 Mhz.

BRIEF DESCRIPTION OF THE DRAWING

A embodiment of the invention is described by way of example with reference to the sole FIGURE of the accompanying drawing which is a circuit diagram of a power supply circuit in accordance with the invention designed to supply power to a high-tension current reducer.

MORE DETAILED DESCRIPTION

The FIGURE shows a high-tension line 1 with an electronic current-measuring apparatus 2 and a conventional capacitor voltage transformer which consists of a capacitative voltage divider with a base capacitor 3 and a capacitative column 4 connected in series between the high-tension line 1 and the ground, together with a medium or low-tension circuit connected across the base capacitor 3 and formed by an induction winding 6 and by an intermediate transformer 5. Said medium or low-tension circuit is tuned to the rated frequency of the high-tension wave which travels along the line 1. The current-measuring apparatus 2 which is at the high potential of the line 1 is supplied by a high-frequency generator 7 at ground potential. The signal from said generator 7 is transmitted to the electronic current-measuring apparatus 2 via: a first high-frequency transformer 8 which is only lightly insulated (and is held at ground potential via a first end 9 of its secondary winding and it is connected by the ends of its primary winding to the terminals of the generator 7); a second high-frequency transformer 10 (held at line potential via a first end 11 of its primary winding and connected by the ends of its secondary winding to the power supply input of the electronic current-measuring apparatus); and a coupling circuit which provides high frequency coupling together with galvanical isolation between the secondary winding of the first high-frequency transformer 8 and the primary winding of the second high-frequency transformer 10. Said coupling circuit comprises: firstly said capacitative column 4 and its base capacitor 3 which in series connect together the first ends 9 and 11 of the secondary winding of the first high-frequency transformer 8 and of the primary winding of the second high-frequency transformer 10; and secondly a capacitor 12 connected in series with an adjustable self-induction winding 13 in between the second ends 14 and 15 of the secondary winding of the first high-frequency transformer 8 and of the primary winding of the second high-frequency transformer 10. The adjustable self-induction winding 13 is adjusted so as to make the coupling circuit resonant in series form to the operating frequency of the generator 7.

The high-frequency transformers 8 and 10 which, at most, have to provide low-tension isolation are easy to produce. They are, for example, wide-band ferrite-core transformers.

The capacitive column already provides galvanic isolation inside the capacitor voltage transformer and its use in the supply circuit does not apply any further load on it. The capacitor 12 must withstand the same tension as the capacitative column 4. Its constitution is analogous to that of the capacitative column but the value of its capacitance is at least one order of magnitude smaller so as not to disturb the operation of the capacitative column 4 in the voltage divider.

The high-frequency transformers 8 and 10 are equipped with spark gaps or lightning arrestors 16 and 17 which protect them against overvoltages due to steep-front voltage waves which affect the line in particular when it is being energized or de-energized.

The generator 7 is advantageously an RF transmitter with a few watts of power output operating at a frequency of 1.5 Mhz. The design of the supply circuit could also include a special capacitor instead of using the capacitative column 4, or, even, a capacitor belonging to a capacitative coupler used for teletransmissions over the high-tension line 1. It is quite obvious that the operating frequency of the generator 7 should be chosen to lie in a zone remote from the teletransmission frequencies.

We claim:

1. A power supply circuit for electronic apparatus at a high electric potential relative to the ground, said power supply circuit comprising:

a generator at ground potential and comprising means for delivering power for said electronic apparatus in the form of a high-frequency signal at an operating frequency;

a first lightly insulated transformer having a primary winding connected to output terminals of the generator and a secondary winding having one end connected to a low potential relative to the ground;

a second lightly insulated transformer having a secondary winding connected to the power supply input of said electronic apparatus and a primary winding having one end connected to said high potential;

and a coupler circuit coupling the secondary winding of the first transformer to the primary winding of the second transformer at said operating frequency of said generator, said coupling circuit having two capacitors interconnecting respective pairs of the end of said coupled windings, thereby providing galvanic isolation therebetween while transmitting power at said operating frequency.

2. A circuit according to claim 1, wherein the coupling circuit further includes an adjustable self-induction winding connected in series with one of said capacitors and adjusted so as to make the loop formed by the secondary winding of the first lightly insulated transformer, by the primary winding of the second lightly insulated transformer and by the components of the coupling circuit resonate at said operating frequency of said generator.

3. A circuit according to claim 1, wherein the secondary winding of the first transformer and the primary winding of the second transformer are equipped with lightning arrestors which protect them against overvoltages.

4. A circuit according to claim 1, wherein the secondary winding of the first transformer and the primary winding of the second transformer are equipped with spark gaps which protect them against overvoltages.

5. A circuit according to claim 1, wherein the generator operates at a frequency of about 1.5 Mhz.

6. A circuit according to claim 1 for supplying power to electronic apparatus at a high potential and located near to a capacitor voltage transformer also used for monitoring said high potential, wherein one of the capacitors of the capacitor voltage trnasformer constitutes a first one of the capacitors of said coupling circuit and wherein the other capacitor of said coupling circuit has a cpacitance which is about one order of magnitude less than the capacitance of said first one of the capacitors of the coupling circuit.

7. A circuit according to claim 1, for supplying power to electronic apparatus at the high potential of a high-tension electric line and located near to a capacitive coupler which is also used to effect teletransmissions along the line, wherein one of the capacitors of said capacitive coupler constitutes a first one of capacitors of said coupling circuit.

* * * * *